United States Patent
Sander et al.

(10) Patent No.: US 6,198,347 B1
(45) Date of Patent: Mar. 6, 2001

(54) DRIVING CIRCUITS FOR SWITCH MODE RF POWER AMPLIFIERS

(75) Inventors: Wendell Sander, Los Gatos; Earl W. McCune, Jr., Santa Clara; Ronald A. Meck, Soquel, all of CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/362,880

(22) Filed: Jul. 29, 1999

(51) Int. Cl.$^7$ ..................................... H03F 3/217
(52) U.S. Cl. ..................... 330/251; 330/300; 330/311
(58) Field of Search .................... 330/207 A, 251, 330/302, 311, 263, 267, 300

(56) References Cited

U.S. PATENT DOCUMENTS

| | | | |
|---|---|---|---|
| 3,919,656 | * 11/1975 | Sokal et al. | 330/251 X |
| 4,717,884 | * 1/1988 | Mitzlaff | 330/251 |
| 4,733,194 | * 3/1988 | Roehrs et al. | 330/251 |
| 5,187,580 | * 2/1993 | Porter et al. | 330/251 X |

* cited by examiner

Primary Examiner—Steven J. Mottola

(57) ABSTRACT

The present invention, generally speaking, provides an RF amplifier circuit architecture that enables high efficiency to be achieved while avoiding complicated matching networks and load networks. The active device may be of the bipolar transistor type or the FET (field effect transistor) type. A simple driving circuit is provided for each type of active device. In accordance with one embodiment of the invention, a single-ended switch mode RF amplifier includes an RF input signal; an active device having a control terminal; and a non-resonant driving circuit for receiving the RF input signal and controlling a signal applied to the control terminal so as to operate the active device in switch mode.

9 Claims, 4 Drawing Sheets

DRIVING CIRCUITS FOR SWITCH MODE RF POWER AMPLIFIERS

BACKGROUND OF THE INVENTION

1. Field of the Invention

The present invention relates to driving circuits for switch mode radio frequency (RF) power amplifiers.

2. State of the Art

Battery life is a significant concern in wireless communications devices such as cellular telephones, pagers, wireless modems, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency would satisfy an acute need.

Furthermore, most modern digital wireless communications devices operate on a packet basis. That is, the transmitted information is sent in a series of one or more short bursts, where the transmitter is active only during the burst times and inactive at all other times. It is therefore also desirable that control of burst activation and deactivation be controlled in an energy-efficient manner, further contributing to extended battery life.

Power amplifiers are classified into different groups: Class A, Class B, Class AB, etc. The different classes of power amplifiers usually signify different biasing or load conditions. In designing an RF power amplifier, there is usually a trade-off between linearity and efficiency. The different classes of amplifier operation offer designers ways to balance these two parameters.

Generally speaking, power amplifiers are divided into two different categories, linear and non-linear. Linear amplifiers (e.g. Class A amplifiers and Class B push-pull amplifiers), maintain high linearity, resulting in faithful reproduction of the input signal at their output since the output signal is linearly proportional to the input signal. In non-linear amplifiers (e.g. single-ended Class B and Class C amplifiers), the output signal is not directly proportional to the input signal. The resulting amplitude distortion on the output signal makes these amplifiers most applicable to signals without any amplitude modulation, which are also known as constant-envelope signals.

Amplifier output efficiency is defined as the ratio between the RF output power and the input (DC) power. A major source of power amplifier inefficiency is power dissipated in the transistor. A Class A amplifier is inefficient since current flows continuously through the device, whether or not there is an output signal. Conventionally, efficiency is improved by trading-off linearity for increased efficiency. In Class B amplifiers, for example, biasing conditions are chosen such that the output signal is cut off during half of the cycle unless the opposing half is provided by a second transistor (push-pull). As a result, the waveform will be less linear. The output waveform may still be made sinusoidal using a tank circuit or other filter to filter out higher and lower frequency components.

Class C amplifiers conduct during less than 50% of the cycle, in order to further increase efficiency; i.e., if the output current conduction angle is less than 180 degrees, the amplifier is referred to as Class C. This mode of operation can have a greater efficiency than Class A or Class B, but it typically creates more distortion than Class A or Class B amplifiers. In the case of a Class C amplifier, there is still some change in output amplitude when the input amplitude is varied. This is because the Class C amplifier operates as a controlled current source—albeit one that is only on briefly—and not as a switch.

The remaining classes of amplifiers vigorously attack the problem of power dissipation within the transistor, using the transistor merely as a switch. The underlying principle of such amplifiers is that a switch ideally dissipates no power, for there is either zero voltage across it or zero current through it. Since the switch's V-I product is therefore always zero, there is (ideally) no dissipation in this device. A Class E power amplifier uses a single transistor, in contrast with a Class D power amplifier, which uses two transistors In real life, however, switches are not ideal. (Switches have turn on/off time and on-resistance.) The associated dissipation degrades efficiency. The prior art has therefore sought for ways to modify so-called "switch-mode" amplifiers (in which the transistor is driven to act as a switch at the operating frequency to minimize the power dissipated while the transistor is conducting current) so that the switch voltage is zero for a non-zero interval of time about the instant of switching, thereby decreasing power dissipation. The Class E amplifier uses a reactive output network that provides enough degrees of freedom to shape the switch voltage to have both zero value and zero slope at switch turn-on, thus reducing switching losses. Class F amplifiers are still a further class of switch-mode amplifiers. Class F amplifiers generate a more square output waveform as compared to the usual sinewave. This "squaring-up" of the output waveform is achieved by encouraging the generation of odd-order harmonics (i.e., x3, x5, x7, etc.) and suppressing the even-order harmonics (i.e., x2, x4, etc.) in the output network.

FIG. 1 shows an example of a known Class E power amplifier, described in U.S. Pat. No. 3,919,656, incorporated herein by reference. An RF input signal is coupled over a lead 1 to a driver stage 2, the latter controlling the active device 5 via a signal coupled over a lead 3. The active device 5 acts substantially as a switch when appropriately driven by the driver 2. The output port of the active device is therefore represented as a single-pole single-throw switch 6. Connected across the switch 6 is the series combination of a DC power supply 7 and the input port of a load network 9. The output port of the load network 9 is connected to the load 11. As the switch 6 is cyclically operated at the desired AC output frequency, DC energy from the power supply 7 is converted into AC energy at the switching frequency (and harmonics thereof).

The arrangement of FIG. 1, although it is capable of achieving high conPATENT version efficiency, suffers from the disadvantage that large voltage swings occur at the output of the active device, due to ringing. This large voltage swing, which typically exceeds three times the supply voltage, precludes the use of the Class E circuit with certain active devices which have a low breakdown voltage.

Furthermore, the driving circuit in the RF amplifier typically includes a matching network consisting of a tuned (resonant) circuit. Referring to FIG. 2, in such an arrangement, an RF input signal is coupled to a driver amplifier, typically of Class A operation. An output signal of the driver amplifier is coupled through the matching network to a control terminal of the switching transistor, shown in FIG. 2 as an FET. As with design of the load network of FIG. 1, proper design of the matching network is not an easy matter.

SUMMARY OF THE INVENTION

The present invention, generally speaking, provides an RF amplifier circuit architecture that enables high efficiency to be achieved while avoiding complicated matching networks and load networks. The active device may be of the bipolar transistor type or the FET (field effect transistor) type. A simple driving circuit is provided for each type of active device. In accordance with one embodiment of the invention, a single-ended switch mode RF amplifier includes an RF input signal; an active device having a control terminal; and a non-resonant driving circuit for receiving the RF input signal and controlling a signal applied to the control terminal so as to operate the active device in switch mode.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
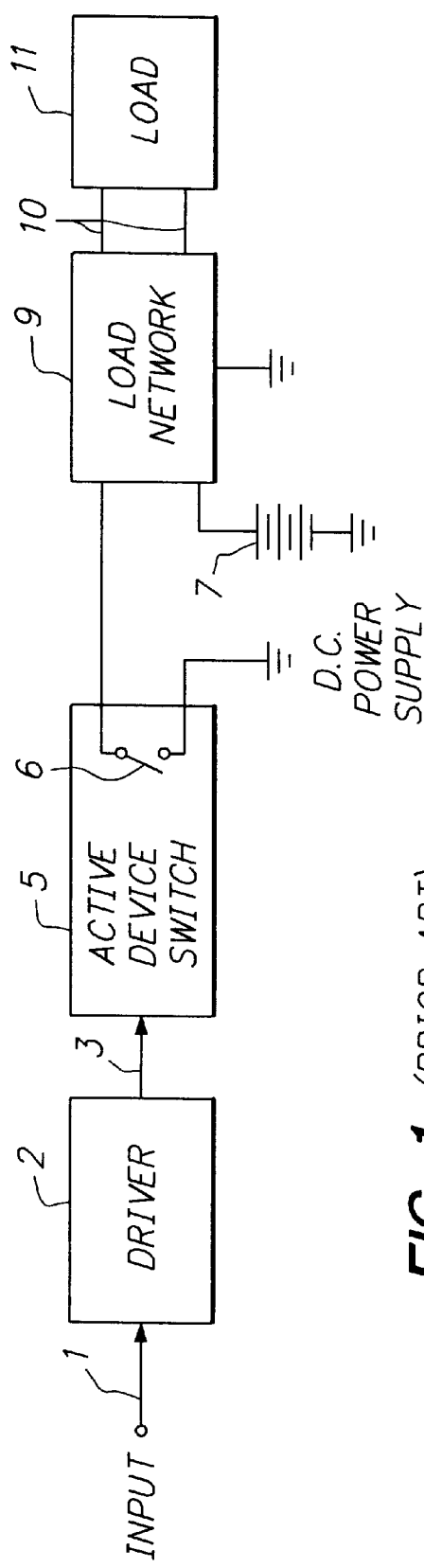
FIG. 1 is a simplified block diagram of a known single-ended switch mode RF amplifier.
Figure 2:
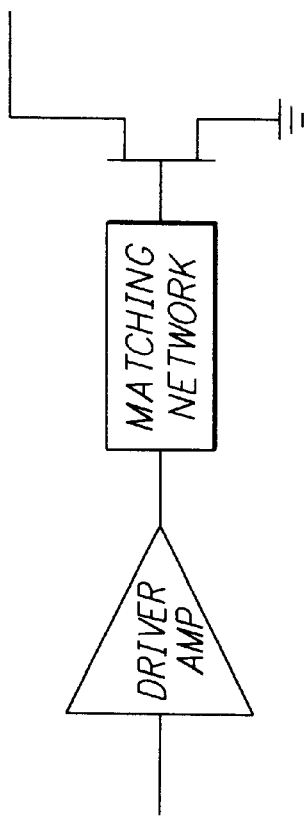
FIG. 2 is a schematic diagram of a portion of a known RF amplifier.
Figure 3:
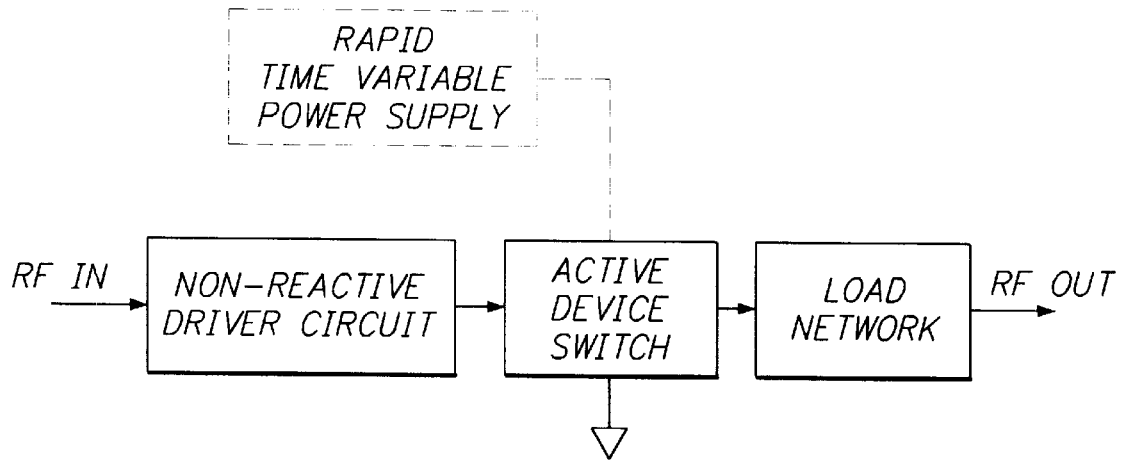
FIG. 3 is a block diagram of an RF switch mode amplifier in accordance with the present invention.

Referring now to FIG. 3, there is shown a block diagram of an RF switch mode amplifier in accordance with a preferred embodiment of the present invention. An RF input signal is applied to a non-reactive driving circuit. The driving circuit is coupled to an active device to drive the active device switch. The active device switch is coupled to a load network that produces an RF output signal for application to a load, e.g., an antenna. Preferably, power is applied to the active device switch through a rapid time variable power supply, realized by the series combination of a switch mode power supply and a linear regulator, enabling the operating voltage of the active device switch to be varied. By varying the operating voltage in a controlled manner, power control, burst control and modulation may be achieved as described more fully in U.S. patent application Ser. No. 09/416,865 filed Oct. 13, 1999, incorporated herein by reference.

Figure 4:
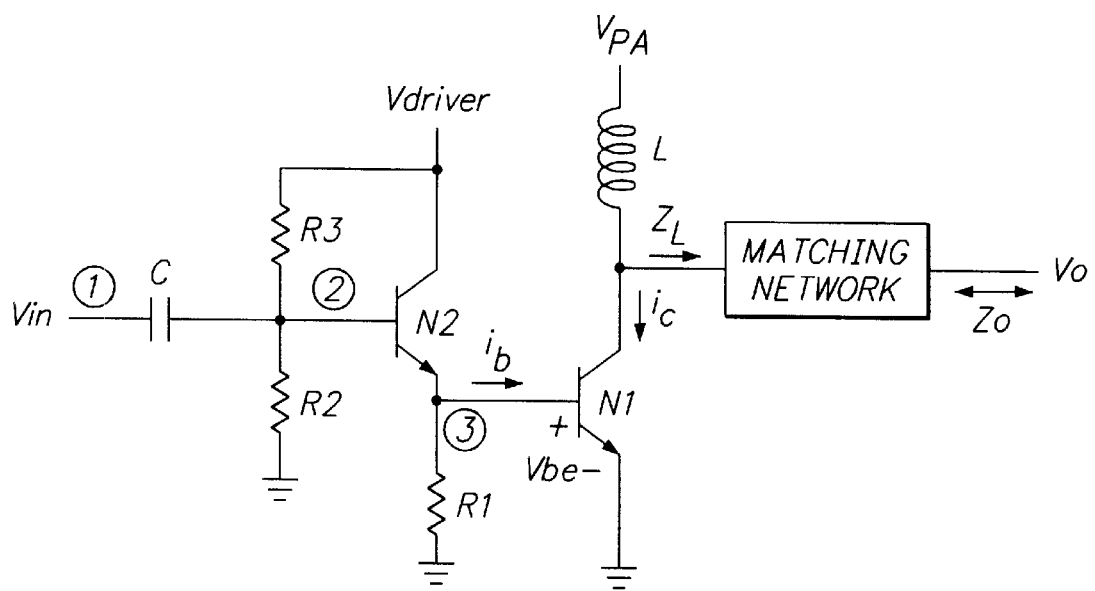
FIG. 4 is a schematic diagram of a portion of an RF switch mode amplifier in accordance with one embodiment of the present invention.

The active device switch may be either a bipolar transistor or a FET transistor. RefelTing to FIG. 4, a schematic diagram is shown of a portion of an RF switch mode amplifier in which the active device switch is a bipolar transistor having collector, emitter and base terminals. The collector of the bipolar transistor N1 is connected through an RF choke L to an operating voltage $V_{PA}$ and is also connected to an output network. The emitter of the bipolar transistor N1 is connected to circuit (AC) ground.

The base of the bipolar transistor N1 is connected to the emitter of another bipolar transistor N2 (the driver transistor) in Darlington fashion. The collector of the driver transistor N2 is connected to an operating voltage $V_{DRIVER}$ and is also connected to a bypass capacitor. Associated with the driver transistor N2 is a bias network including, in the illustrated embodiment, three resistors, R1, R2 and R3. One resistor R1 is connected from the emitter of the driver transistor to circuit ground. Another resistor R2 is connected from the base of the driver transistor to ground. The final resistor R3 is connected from the base of the driver transistor N2 to $V_{DRIVER}$. An RF input signal is applied to the base of the driver transistor through a DC isolation capacitor $C_{in}$.

Figure 5:
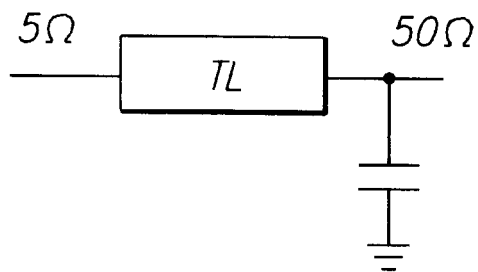
FIG. 5 is a schematic diagram of a suitable load network for use in the RF switch mode amplifier of FIG. 4.

Referring to FIG. 5, the output network may take the form of an impedance-matching transmission line TL and a capacitor $C_{out}$.

Figure 6:
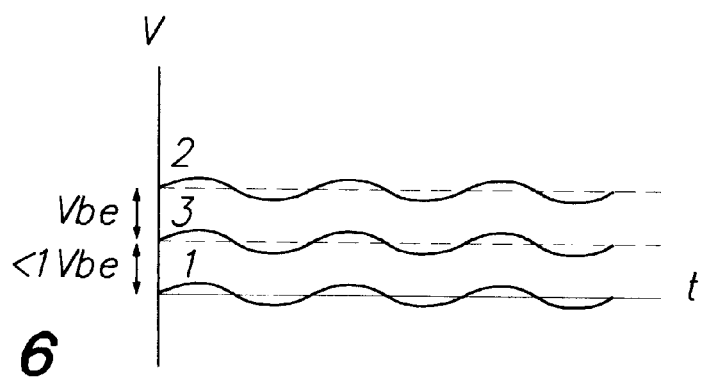
FIG. 6 is a waveform diagram showing input voltage and related waveforms for the RF switch mode amplifier of FIG. 4.
Figure 7:
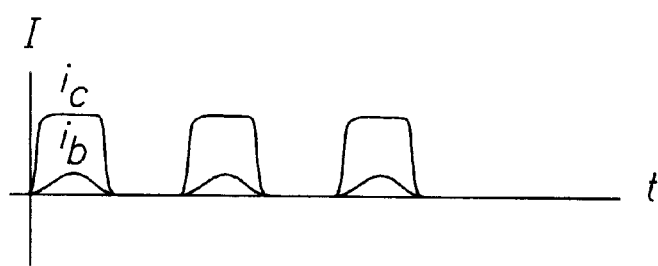
FIG. 7 is a waveform diagram showing base and collector current waveforms of the switching transistor of FIG. 4.
Figure 8:
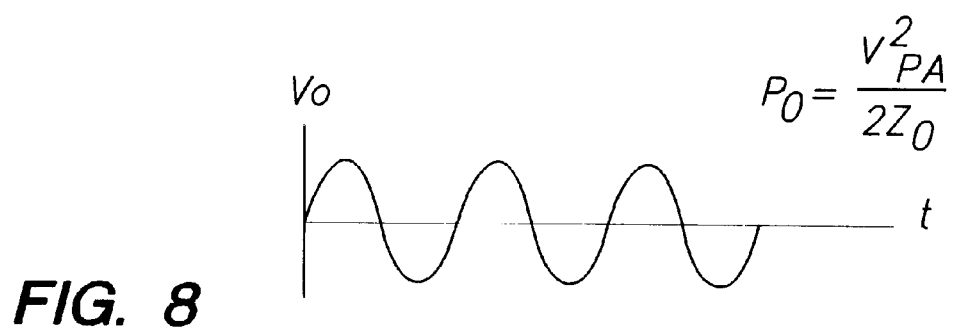
FIG. 8 is a waveform diagram showing output voltage for the RF switch mode amplifier of FIG. 4.

The RF input voltage signal is sinusoidal as shown by waveform 1 of FIG. 6. The input voltage is level shifted upward to produce a voltage at the base of the driver transistor N2, shown by waveform 2. The emitter voltage of the driver transistor N2, shown by waveform 3, is one $V_{be}$ drop below and is applied to the base of the switching transistor N1. At the beginning of the positive half-cycle, the driver transistor N2 is operating as an emitter follower, with output (emitter) voltage sufficiently below the turn-on voltage of the switching transistor N1 so that the switching transistor N1 is cut off. As the signal increases, the driver transistor N2 turns the switching transistor N1 on and drives it into saturation as shown in FIG. 7. Current flows through the RF choke L and through the switching transistor N1, and the output voltage decreases as the capacitor $C_{out}$ is discharged as shown in FIG. 8. Near the end of the positive half-cycle, the driver transistor N2 output voltage falls below the turn-on voltage of the switching transistor N1, allowing it to turn off. The value of the resistor R1 is chosen such that the switching transistor N1 quickly cuts off. Current continues to flow through the RF choke L, charging the capacitor $C_{out}$ and causing the output voltage to increase.

Figure 9:
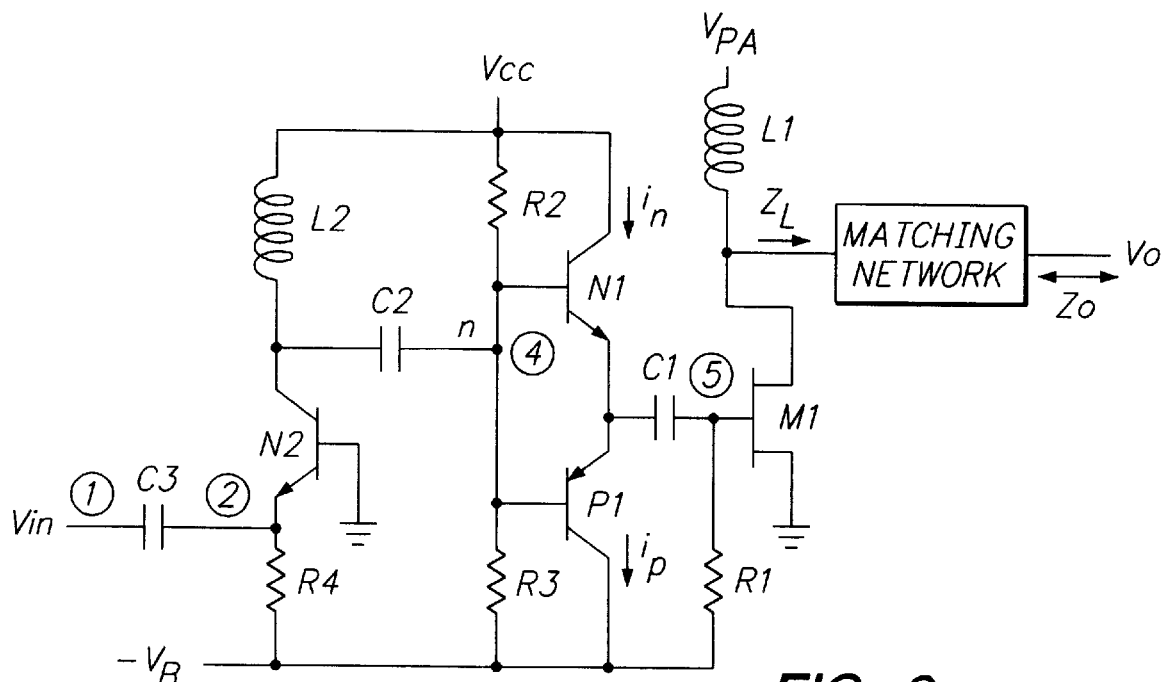
FIG. 9 is a schematic diagram of a portion of an RF switch mode amplifier in accordance with another embodiment of the present invention.

Referring to FIG. 9, a schematic diagram is shown of a portion of an RF switch mode amplifier in which the active device switch is a FET transistor (MES-FET, JFET, PHEMT, etc.) having drain, source and gate terminals. The drain of the FET transistor M1 is connected through an RF choke L1 to an operating voltage $V_{PA}$ and is also connected to an output network. The source of the FET transistor is connected to circuit (AC) ground.

The gate of the FET transistor is biased from supply $-V_B$ through a large value resistor R1, and is further connected through a DC isolation capacitor C1 to a pair of bipolar transistors (driver transistors) connected in push-pull arrangement. The driver transistors include an NPN transistor N1 and a PNP transistor P1. The collector of the NPN driver transistor N1 is connected to an operating voltage $V_{CC}$ and is also connected to a bypass capacitor. The collector of the PNP driver transistor PI is connected to a negative reference voltage $-V_B$ and is also connected to a bypass capacitor. The bases of the driver transistors are connected in common. Large-valued resistors R2 and R3 connect the common node to the respective power supply rails.

A further NPN bipolar transistor N2 is connected in common base configuration. The emitter of the further bipolar transistor is connected through a resistor R4 to $-V_B$ and is connected through a capacitor C3 to the RF input signal. The collector of the further bipolar transistor is connected through an inductor L2 to $V_{CC}$ and is also connected to a bypass capacitor.

Figure 10:
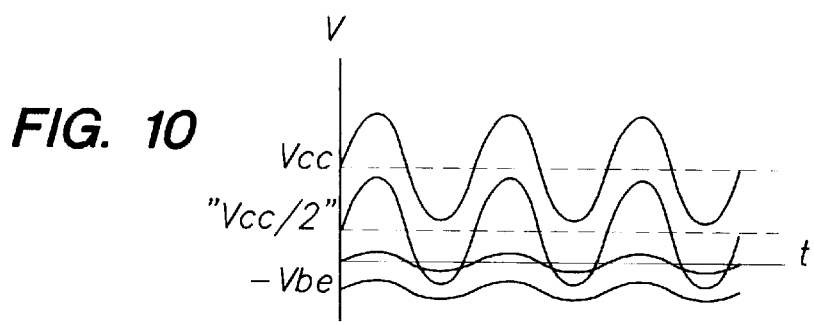
FIG. 10 is a waveform diagram showing input voltage and related waveforms for the RF switch mode amplifier of FIG. 9.
Figure 11:
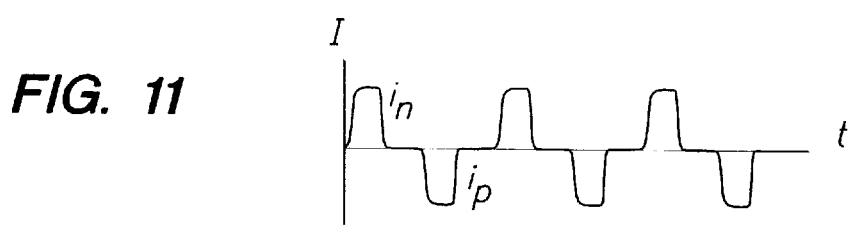
FIG. 11 is a waveform diagram showing collector current waveforms of the drive transistors of FIG. 9.
Figure 12:
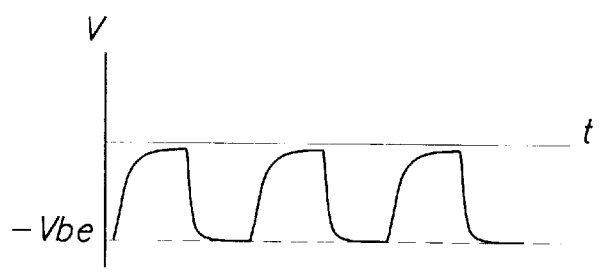
FIG. 12 is a waveform diagram showing a gate voltage waveform of the switching transistor of FIG. 9.

Referring to FIG. 10, input voltage waveforms 1–4 are shown for the circuit of FIG. 9. The input voltage 1 is level shifted down one $V_{be}$ and is applied to the emitter of the bipolar transistor N2. A large voltage swing 3 is produced at the collector of the bipolar transistor N2 by action of the inductor L2. This voltage swing is level shifted downward to produce a voltage 4 that is applied to the bases of the driver transistors at node N. In operation, during the positive half-cycle, initially the further bipolar transistor N2 is turned off. Current flows through the inductor L2 into the capacitor C2 coupled to the bases of the transistor pair, causing the NPN transistor N to turn on and causing the PNP transistor P1 to turn off (FIG. 11). The DC isolation capacitor C is charged up from the $V_{CC}$ supply, raising the gate potential of the FET M1, causing it to turn on (FIG. 12). During the negative half-cycle, the further bipolar transistor N2 is turned on. Current flows through the inductor L2, through the further transistor N2 to the $-V_B$ rail. Current also flows out of the base of the PNP transistor P1, turning it on. The DC isolation capacitor C1 discharges, lowering the gate potential of the FET M1, causing it to turn off. The output network operates in the same manner as previously described.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A single-ended switch mode RF amplifier, comprising:
   an RF input signal;
   a bipolar switching transistor having a collector, a base and an emitter; and
   a driving circuit for receiving the RF input signal and controlling a signal applied to the control terminal so as to operate the bipolar switching transistor in switch mode, comprising:
   a bipolar driver transistor having a collector, a base and an emitter, the emitter of the bipolar driver transistor being connected to the base of the bipolar switching transistor; and
   a passive impedance element coupled from the emitter of the bipolar driver transistor to a fixed potential.

2. The apparatus of claim 1, wherein the RF input signal is coupled to the base of the bipolar driver transistor.

3. The apparatus of claim 2, wherein the RF input signal is coupled to the base of the bipolar driver transistor through a DC isolation capacitor.

4. A single-ended switch mode RF amplifier, comprising:
   an RF input signal;
   a FET switching transistor having a drain, a source and a gate; and
   a driving circuit for receiving the RF input signal and controlling a signal applied to the control terminal so as to operate the active device in switch mode, comprising:
   a pair of bipolar driver transistors each having a collector, a base and an emitter and connected in push-pull arrangement, the emitters of the bipolar driving transistors being connected to gate of the FET switching transistor; and
   a further bipolar transistor having a collector, a base and an emitter, the further bipolar transistor being configured in common base configuration, the collector of the further bipolar transistor being coupled to the bases of the pair of bipolar transistors.

5. The apparatus of claim 4, wherein an operating voltage is applied to the FET switching transistor through a reactive element, further comprising means for varying the operating voltage to control RF output power.

6. The apparatus of claim 4, wherein the RF input signal is coupled to the emitter of the further bipolar transistor.

7. The apparatus of claim 6, wherein the RF input signal is coupled to the emitter of the further bipolar transistor through a DC isolation capacitor.

8. The apparatus of claim 6, wherein the collector of the further bipolar transistor is coupled through an inductor to an operating potential.

9. The apparatus of claim 1, wherein an operating voltage is applied to the bipolar switching transistor through a reactive element, further comprising means for varying the operating voltage to control RF output power.

* * * * *